United States Patent
Lee et al.

(10) Patent No.: US 9,761,831 B2
(45) Date of Patent: Sep. 12, 2017

(54) DISPLAY APPARATUS AND METHOD OF MANUFACTURING THE SAME

(71) Applicant: SAMSUNG DISPLAY CO., LTD., Yongin, Gyeonggi-Do (KR)

(72) Inventors: Keun-Soo Lee, Yongin (KR); Yong-Hwan Park, Yongin (KR); Chi-Wook An, Yongin (KR); Seong-Jun Lee, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/712,737

(22) Filed: May 14, 2015

(65) Prior Publication Data

US 2015/0364717 A1     Dec. 17, 2015

(30) Foreign Application Priority Data

Jun. 13, 2014    (KR) .................. 10-2014-0072006

(51) Int. Cl.
  *H01L 51/52*    (2006.01)
  *H01L 51/00*    (2006.01)

(52) U.S. Cl.
  CPC ...... *H01L 51/5253* (2013.01); *H01L 51/0097* (2013.01); *H01L 2251/558* (2013.01)

(58) Field of Classification Search
  CPC .. H01L 51/50; H01L 51/5253; H01L 51/0097
  See application file for complete search history.

(56) References Cited

U.S. PATENT DOCUMENTS

| 2008/0211398 | A1* | 9/2008 | DeCook | H01L 51/5237 |
| | | | | 313/506 |
| 2009/0032096 | A1* | 2/2009 | Tanaka | H01L 31/032 |
| | | | | 136/256 |
| 2013/0062727 | A1 | 3/2013 | Huang et al. | |
| 2015/0232621 | A1* | 8/2015 | Jeong | C08G 73/1067 |
| | | | | 257/40 |

FOREIGN PATENT DOCUMENTS

KR    1020130028531    *   3/2013   ............ H01L 51/50

OTHER PUBLICATIONS

Lee at al. Korean Patent Publication No. 10-2013-0028531. Machine translation in English retrieved from Korean Intellectual Property Office website.*

* cited by examiner

*Primary Examiner* — Michael Jung
*Assistant Examiner* — Mikka Liu
(74) *Attorney, Agent, or Firm* — Lewis Roca Rothgerber Christie LLP

(57)    ABSTRACT

A display apparatus includes: a substrate; a display unit disposed on the substrate; a barrier unit disposed between the substrate and the display unit; and a buffer unit disposed between the barrier unit and the display unit, wherein a sum of a thickness of the barrier unit and a thickness of the buffer unit is in the range from 0.9 μm to 3 μm.

16 Claims, 7 Drawing Sheets

DISPLAY APPARATUS AND METHOD OF MANUFACTURING THE SAME

CROSS-REFERENCE TO RELATED APPLICATION

This application claims priority to and the benefit of Korean Patent Application No. 10-2014-0072006, filed on Jun. 13, 2014, in the Korean Intellectual Property Office, the disclosure of which is incorporated herein in its entirety by reference.

BACKGROUND

1. Field

Aspects of embodiments of the present invention relate to a display apparatus and a method of manufacturing the display apparatus.

2. Description of the Related Art

Recently, display apparatuses have been used for various purposes. Also, as the thickness and weight of these apparatuses have been reduced, the application range thereof has expanded.

In particular, thin and portable display apparatuses have been recently manufactured.

A display apparatus includes a display unit for realizing images. If impurities, humidity, or external air enters the display unit, an operation error or a defect of the display unit may occur.

In particular, if the display apparatus is of a thin type, impurities, humidity, and external air that enter the display unit may severely degrade the characteristics of the display device.

SUMMARY

One or more embodiments of the present invention include a display apparatus and a method of manufacturing the display apparatus.

Additional aspects will be set forth in part in the description which follows and, in part, will be apparent from the description, or may be learned by practice of the presented embodiments.

According to one or more embodiments of the present invention, a display apparatus includes: a substrate; a display unit disposed on the substrate; a barrier unit disposed between the substrate and the display unit; and a buffer unit disposed between the barrier unit and the display unit, wherein a sum of a thickness of the barrier unit and a thickness of the buffer unit is in the range from 0.9 µm to 3 µm.

The barrier unit and the buffer unit each may include an inorganic material.

The barrier unit may include an oxide material or a nitride material.

The barrier unit may include a structure in which an oxide material and a nitride material are stacked.

The barrier unit may include a first barrier unit including silicon oxide and a second barrier layer including silicon nitride, and wherein the first barrier layer is between the second barrier layer and the substrate.

The buffer unit may include an oxide material or a nitride material.

The buffer unit may include a structure in which an oxide material and a nitride material are stacked.

The buffer unit may include a first buffer layer including silicon nitride and a second buffer layer including silicon oxide, and wherein the first buffer layer is between the second buffer layer and the substrate.

An uppermost layer of the buffer unit may contact the display unit and wherein the uppermost layer may include a flat surface.

The substrate may include an organic material.

The substrate may include polyimide, polyethylene naphthalate, polyethylene terephthalate (PET), polyarylate, polycarbonate, polyetherimide (PEI), or polyethersulfone.

The substrate may include a first layer including an organic material, a second layer including an organic material, and an insulating insertion layer disposed between the first layer of the substrate and the second layer of the substrate and including an inorganic material.

The insulating insertion layer may include an oxide material or a nitride material.

The display apparatus may further include a protective layer on a surface of the substrate opposite a surface of the substrate facing the barrier unit.

The display unit may include an organic light emitting device.

The display unit may further include at least one thin film transistor (TFT).

The display apparatus may further include an encapsulation member on the display unit.

According to one or more embodiments of the present invention, a method of manufacturing a display apparatus, the method includes: forming a barrier unit on a substrate; forming a buffer unit on the barrier unit; and forming a display unit on the buffer unit, wherein the forming of the barrier unit and the forming of the buffer unit are performed so that a sum of a thickness of the barrier unit and a thickness of the buffer unit is in the range from 0.9 µm to 3 µm.

The method may further include, before the forming of the display unit, preparing a carrier unit for supporting the substrate and disposing the substrate on the carrier unit.

The carrier unit may be removed before manufacturing of the display apparatus is completed.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
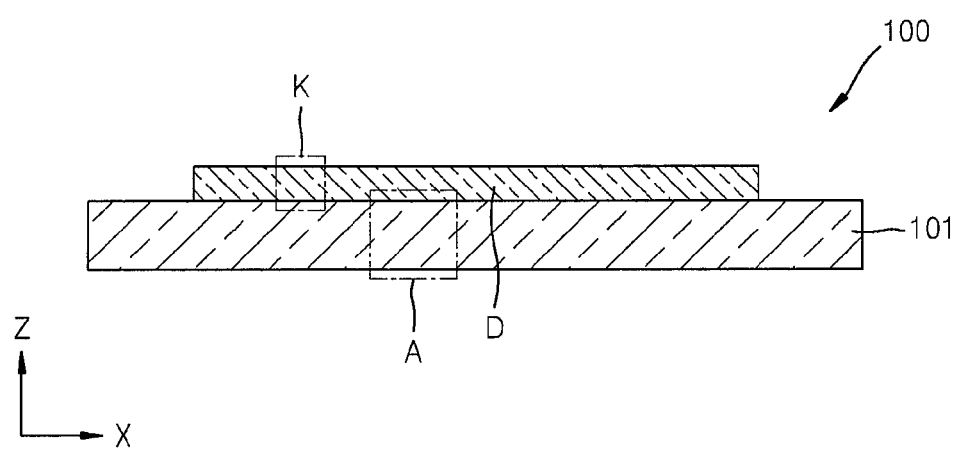
FIG. 1 is a schematic cross-sectional view of a display apparatus according to an embodiment of the present invention.

As aspects of the present invention allow for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

Hereinafter, aspects of the present invention will be described in detail by explaining preferred embodiments of the invention with reference to the attached drawings. Like reference numerals in the drawings denote like elements.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. For example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently than as presented, a specific process order may be performed differently from the described order. For example, two consecutively described processes may be performed substantially at the same time (e.g., concurrently) or performed in an order opposite to the described order. Expressions such as "at least one of," when preceding a list of elements, modify the entire list of elements and do not modify the individual elements of the list.

Figure 3:
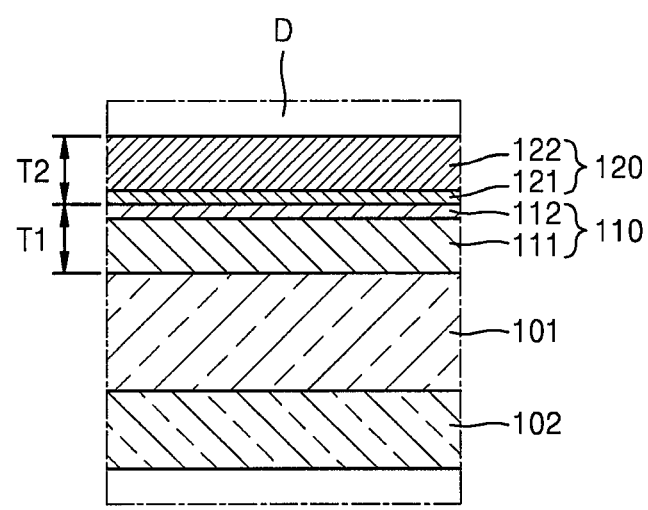
FIG. 3 is an enlarged view of a portion A of FIG. 1.

FIG. 1 is a schematic cross-sectional view of a display apparatus 100 according to an embodiment of the present invention, and FIG. 3 is an enlarged view of a portion A of FIG. 1.

Referring to FIGS. 1, 2A, 2B, and 3, the display apparatus 100 according to the one includes a substrate 101, a display unit D, a buffer unit 120, and a barrier unit 110.

The buffer unit 120 and the barrier unit 110 are disposed between the substrate 101 and the display unit D.

In FIG. 1, an additional member is not disposed on the display unit D of the display apparatus 100. However, embodiments of the present invention are not limited thereto.

Figure 2A:
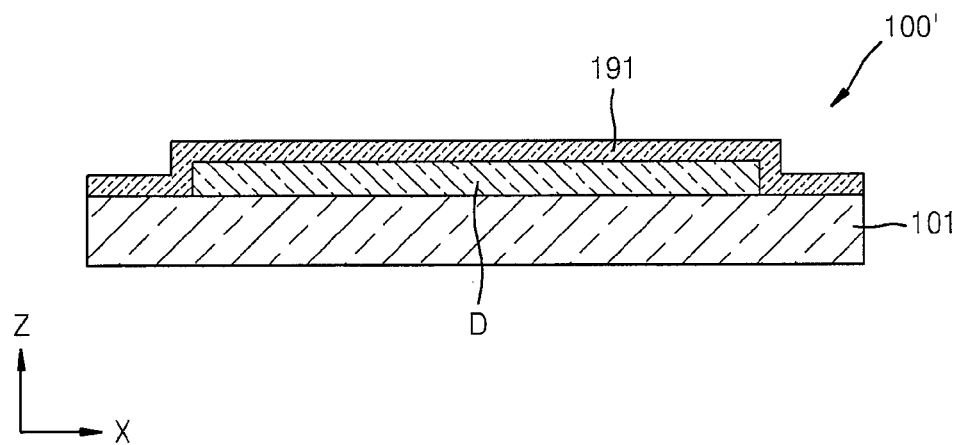
FIGS. 2A and 2B are diagrams of modified embodiments of the display apparatus of FIG. 1 further including an encapsulation member.
Figure 2B:
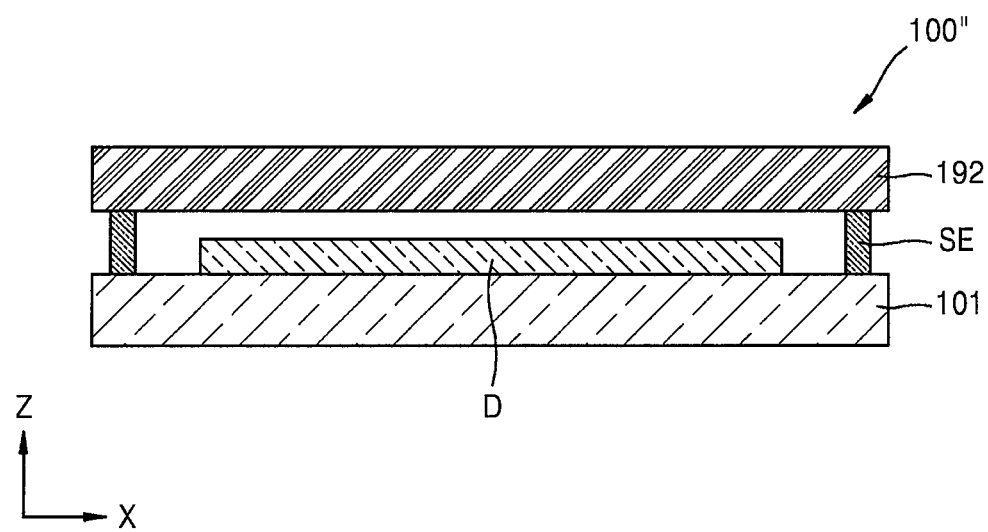

For example, as shown in FIGS. 2A and 2B, one or more encapsulation members 191 and 192 may be further formed on the display unit D.

FIGS. 2A and 2B are diagrams showing modified examples of the display apparatus 100 of FIG. 1 further including an encapsulation member.

In particular, FIG. 2A shows a display apparatus 100' in which an encapsulation member 191, for example, a thin film encapsulation layer, is formed on the display unit D. The encapsulation member 191 may be formed of various insulating materials, for example, an organic material or an inorganic material, and may have a structure in which one or more organic materials and one or more inorganic materials are stacked.

Also, FIG. 2B shows a display apparatus 100" in which an encapsulation member 192 of a substrate type is disposed on (or over) the display unit D to face the substrate 101. A sealing member SE is disposed between the substrate 101 and the encapsulation member 192 so as to couple the substrate 101 and the encapsulation member 192 to each other.

The modified examples shown in FIGS. 2A and 2B are selected embodiments of the present invention, and aspects of the present invention may include other various embodiments in addition to the above modified examples.

The components of the display apparatus 100 according to one embodiment will be described below.

The substrate 101 may be formed of various materials. In particular, the substrate 101 may be formed of a flexible material according to one embodiment, or, according to another embodiment, the substrate 101 may be formed of an organic material. For example, the substrate 101 may contain an organic material having excellent heat resistance and durability such as polyimide, polyethylene naphthalate, polyethylene terephthalate (PET), polyarylate, polycarbonate, polyetherimide (PEI), or polyethersulfone.

The barrier unit 110 and the buffer unit 120 are sequentially formed on the substrate 101. In particular, the barrier unit 110 is formed between the substrate 101 and the display unit D, and the buffer unit 120 is formed between the barrier unit 110 and the display unit D.

In one embodiment of the present invention, a protective layer 102 may be further formed on a surface of the substrate 101, which is opposite a surface facing the barrier unit 110 and the buffer unit 120. The protective layer 102 may block impurities, humidity, or external air from entering a lower portion of the substrate 101, and may also mitigate or prevent deformation of the substrate 101.

The barrier unit 110 is formed on a surface of the substrate 101. The barrier unit 110 may include various insulating materials, and may be formed in various ways.

The barrier unit 110 may provide a planarization layer on an upper surface of the substrate 101, and may impede or prevent infiltration of impurities and humidity into the display unit D from the substrate 101.

The barrier unit 110 may include an inorganic insulating layer, for example, silicon oxide or silicon nitride.

In an embodiment, the barrier unit 110 includes a first barrier layer 111 and a second barrier layer 112. The second barrier layer 112 is formed on the first barrier layer 111. For example, the second barrier layer 112 is disposed farther from the substrate 101 than the first barrier layer 111 (e.g., the first barrier layer 111 is between the second barrier layer 112 and the substrate 101).

Also, in one embodiment of the present invention, the first barrier layer 111 includes silicon oxide, for example, SiOx, and the second barrier layer 112 includes silicon nitride, for example, SiNx.

For example, by forming the first barrier layer 111 adjacent to the substrate 101 and forming the first barrier layer 111 by using silicon oxide, an interfacial bonding property between the first barrier layer 111 and the substrate 101 may be improved. Also, if the second barrier layer 112 includes silicon nitride and a first buffer layer 121 (that will be described later) in the buffer unit 120 includes silicon nitride, an interfacial bonding property between the first barrier layer 111 and the substrate 101 may be improved. Also, if the second barrier layer 112 includes silicon nitride and the first buffer layer 121 (that will be described later) in the buffer unit 120 includes silicon nitride, an interfacial bonding property between the second barrier layer 112 and the first buffer layer 121 may be improved.

The buffer unit 120 is formed on the barrier unit 110. The buffer unit 120 may include various insulating materials, and may be formed on the barrier unit 110 in various ways.

The buffer unit 120 may operate as a planarization layer on an upper surface of the substrate 101, and impedes or prevents infiltration of impurities or humidity into the display unit D from the substrate 101. In particular, because the display unit D is formed on the buffer unit 120, the uppermost surface of the buffer layer 120, for example, a second buffer layer 122 of the buffer unit 120 may include a flat surface.

The buffer unit 120 may include an inorganic insulating layer including, for example, silicon oxide or silicon nitride.

In an embodiment of the present invention, the buffer unit 120 includes the first buffer layer 121 and the second buffer layer 122. The first buffer layer 121 is formed on the barrier unit 110, and the second buffer layer 122 is formed on the first buffer layer 121. For example, the second buffer layer 122 may be disposed farther from the substrate 101 than the first buffer layer 121 is.

Also, the first buffer layer 121 may include silicon nitride, for example, SiNx, and the second buffer layer 122 may include silicon oxide, for example, SiOx.

In particular, in one embodiment, the second buffer layer 122 is formed adjacent to the display unit D, and the second buffer layer 122 containing silicon oxide, and then, interfacial bonding property between the display unit D and the buffer unit 120 may be improved. Also, if the second barrier layer 112 includes silicon nitride and the first buffer layer 121 is includes silicon nitride, the interfacial bonding property between the second barrier layer 112 and the first buffer layer 121 may be improved.

Also, the display unit may include a thin film transistor (TFT), and the TFT includes an active layer 303. The active layer 303 may be formed of a silicon material. In this case, the interfacial bonding property between the active layer 303 including silicon and the second buffer layer 122 including silicon oxide may be improved, and thus, electrical properties of the TFT may be improved.

Also, if the first buffer layer 121 includes silicon nitride, hydrogen may be included in silicon nitride, and thus, the mobility of carriers in the active layer 303 of the TFT may be improved provided that the display unit D formed on the buffer unit 120 includes the TFT. Accordingly, electrical properties of the TFT may be improved.

A sum of a thickness T1 of the barrier unit 110 and a thickness T2 of the buffer unit 120 may range from 0.9 μm to 3 μm.

If a crack is generated or a generated crack starts spreading in the barrier unit 110 and the buffer unit 120 having a total thickness of 0.9 μm, impurities, foreign substances, external air in the substrate 101, or gas remaining after the forming of the substrate 101 may be transferred to the display unit D via the crack in the barrier unit 110 and the buffer unit 120. In this case, the image quality characteristics of the display unit D are degraded, and a defect may occur in the display unit D.

According to one embodiment, the sum of the thickness T1 of the barrier unit 110 and the thickness T2 of the buffer unit 120 is set to be greater than or equal to 0.9 μm (9000 Å).

Figure 4:
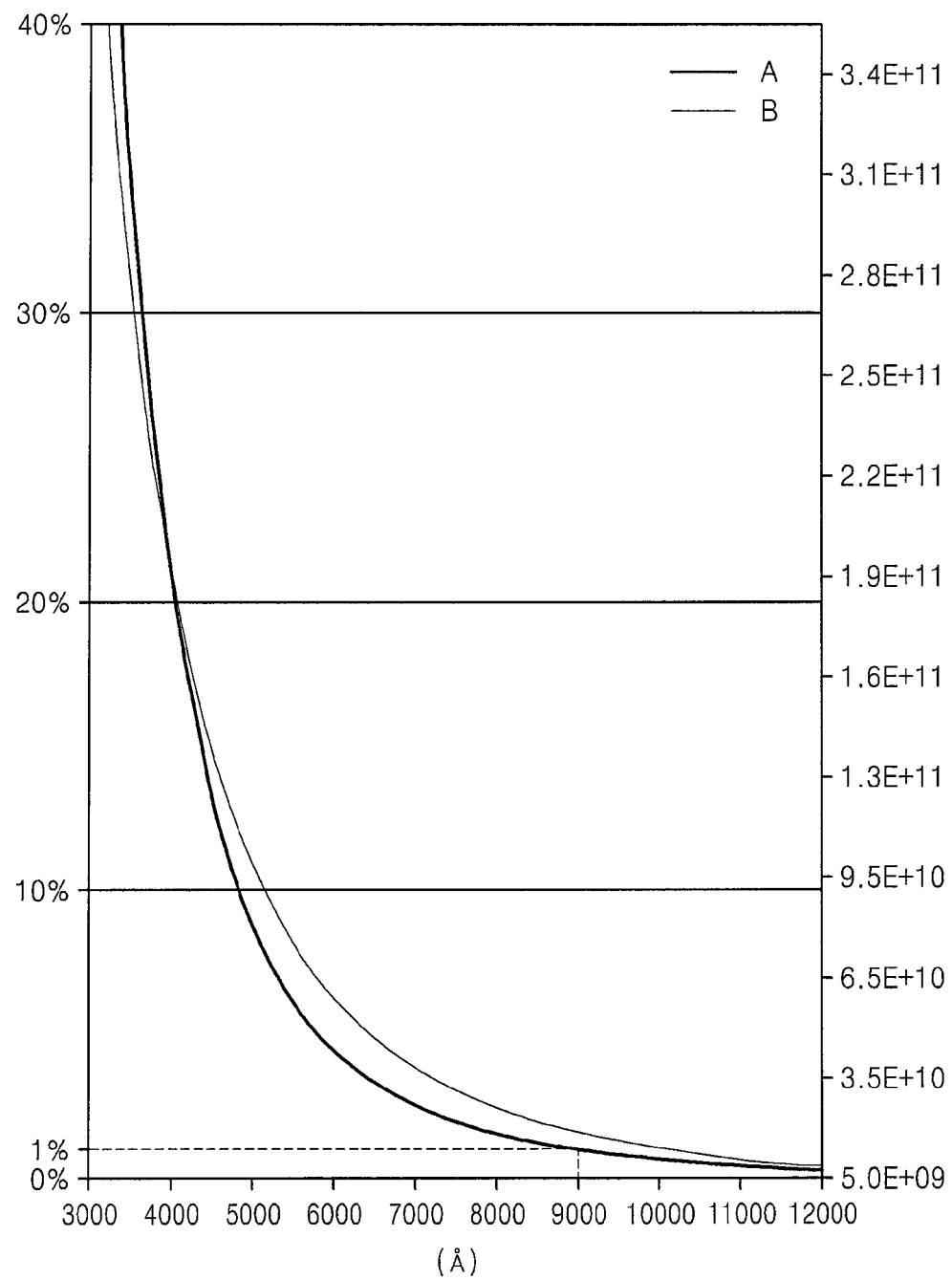
FIG. 4 is a graph showing a variation in characteristics of a display apparatus according to a variation in a sum of a thickness of a barrier unit and a thickness of a buffer unit of FIG. 3.

FIG. 4 is a graph showing variation in characteristics of the display apparatus according to a change in the sum of the thickness T1 of the barrier unit 110 and the thickness T2 of the buffer unit 120 in FIG. 3.

In FIG. 4, line (or graph) A denotes a defect generation rate of the display unit according to the change in the sum of the thickness T1 of the barrier unit 110 and the thickness T2 of the buffer unit 120, and line (or graph) B denotes a reciprocal number of a stiffness of the barrier unit 110/the buffer unit 120 according to the change in the sum of the thickness T1 of the barrier unit 110 and the thickness T2 of the buffer unit 120.

In particular, an X-axis in the graph of FIG. 4 denotes the sum of the thickness T1 of the barrier unit 110 and the thickness T2 of the buffer unit 120, and is represented in a unit of angstroms (Å). A Y-axis in the graph of FIG. 4 denotes a defect generating rate (left side) of the display apparatus and a reciprocal number (right side) of the stiffness of the barrier unit 110/buffer unit 120.

The stiffness is proportional to Young's modulus and a cube of the thickness. For example, the stiffness of the barrier unit 110 and the buffer unit 120 is proportional to a cube of the sum of the thickness T1 of the barrier unit 110 and the thickness T2 of the buffer unit 120.

Referring to FIG. 4, the line B depicting the reciprocal number of the stiffness of the barrier unit 110 and the buffer unit 120 has a curved shape that is similar to the defect generating rate of the display apparatus. For example, the reciprocal number of the stiffness of the barrier unit 110 and the buffer unit 120 is proportional to the defect generating rate of the display apparatus. Thus, if the stiffness of the barrier unit 110 and the buffer unit 120 increases, the defect generating rate of the display apparatus is reduced.

In particular, when the sum of the thickness T1 of the barrier unit 110 and the thickness T2 of the buffer unit 120 increases, the reciprocal number of the stiffness of the barrier unit 110 and the buffer unit 120 is reduced. For example, the stiffness of the barrier unit 110 and the buffer unit 120 increases. Also, when the sum of the thickness T1 of the barrier unit 110 and the thickness T2 of the buffer unit 120 increases, the defect generating rate of the display apparatus is reduced.

In particular, if the sum of the thickness T1 of the barrier unit 110 and the thickness T2 of the buffer unit 120 is greater than or equal to 0.9 μm (9000 Å), the defect generating rate of the display apparatus is reduced to 1% or less.

Therefore, the sum of the thickness T1 of the barrier unit 110 and the thickness T2 of the buffer unit 120 is set to be greater than or equal to 0.9 μm so as to effectively impede or prevent humidity or impurities from infiltrating into the barrier unit 110 and the buffer unit 120. Also, by setting the sum of the thickness T1 of the barrier unit 110 and the thickness T2 of the buffer unit 120 to be greater than or equal to 0.9 μm, the spread of a crack that may be generated in the display unit D or the substrate 101 to the barrier unit 110 and the buffer unit 120 may be mitigated or prevented. Also, generation of a crack in the barrier unit 110 and the buffer unit 120 may be mitigated or prevented.

Also, if the sum of the thickness T1 of the barrier unit 110 and the thickness T2 of the buffer unit 120 is increased from 0.8 μm to 0.9 μm, the defect generating rate is reduced from about 2% to about 1%. On the other hand, if the sum of the thickness T1 of the barrier unit 110 and the thickness T2 of the buffer unit 120 is increased from 0.9 μm to 1 μm, the defect generating rate is reduced from about 1% to about 0.9%, that is, the defect generating rate barely changes. Therefore, in order to effectively reduce the defect generating rate by increasing the thickness T1 of the barrier unit 110 and the thickness T2 of the buffer unit 120, the sum of the thickness T1 of the barrier unit 110 and the thickness T2 of the buffer unit 120 is set to be equal to at least 0.9 μm.

According to some embodiments of the present invention, the sum of the thickness T1 of the barrier unit 110 and the thickness T2 of the buffer unit 120 is set to be equal to 3 μm or less so that flexibility of the substrate 101 may be maintained even when the barrier unit 110 and the buffer unit 120 are used, thereby realizing a display apparatus 100 that is flexible.

If the sum of the thickness T1 of the barrier unit 110 and the thickness T2 of the buffer unit 120 exceeds 3 μm, efficiency of processes for manufacturing the barrier unit 110 and the buffer unit 120 is degraded, and flexibility of the display apparatus 100 is reduced. Thus, user's convenience and characteristics in manufacturing processes may be degraded.

In an embodiment of the present invention, the first barrier layer 111 of the barrier unit 110 may have a thickness of 5000 Å, the second barrier layer 112 may have a thickness of 600 Å, the first buffer layer 121 of the buffer unit 120 may have a thickness of 500 Å, and the second buffer layer 122 may have a thickness of 4000 Å.

The display unit D is formed on the buffer unit 120. According to an embodiment, an insertion buffer layer may be further disposed between the display unit D and the buffer unit 120 for mitigating or preventing the infiltration of impurities and operating as a planarization layer. The display unit D will be described below with reference to FIGS. 5, 6, and 7.

Figure 5:
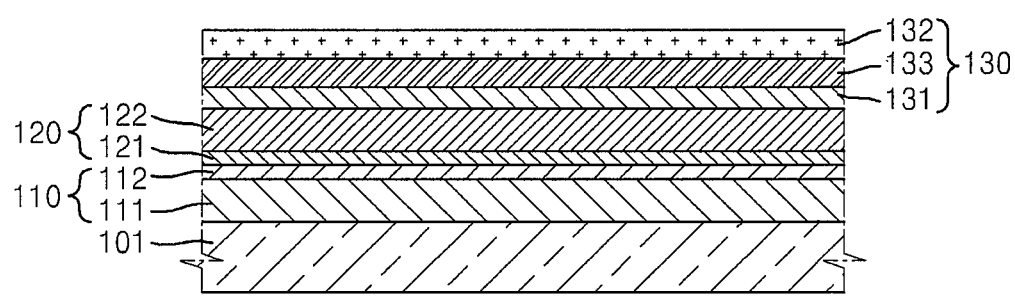
FIG. 5 is an enlarged view of a portion K of FIG. 1.
Figure 6:
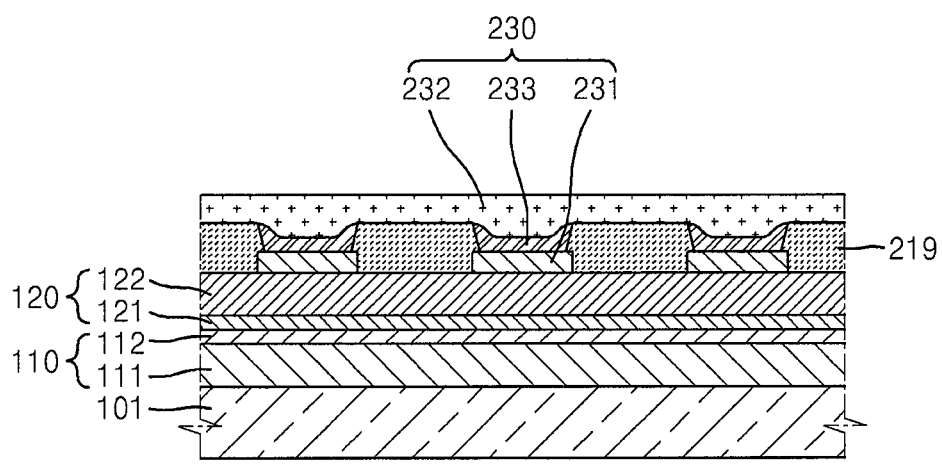
FIGS. 6 and 7 are diagrams showing modified embodiments of the portion K in FIG. 1.
Figure 7:
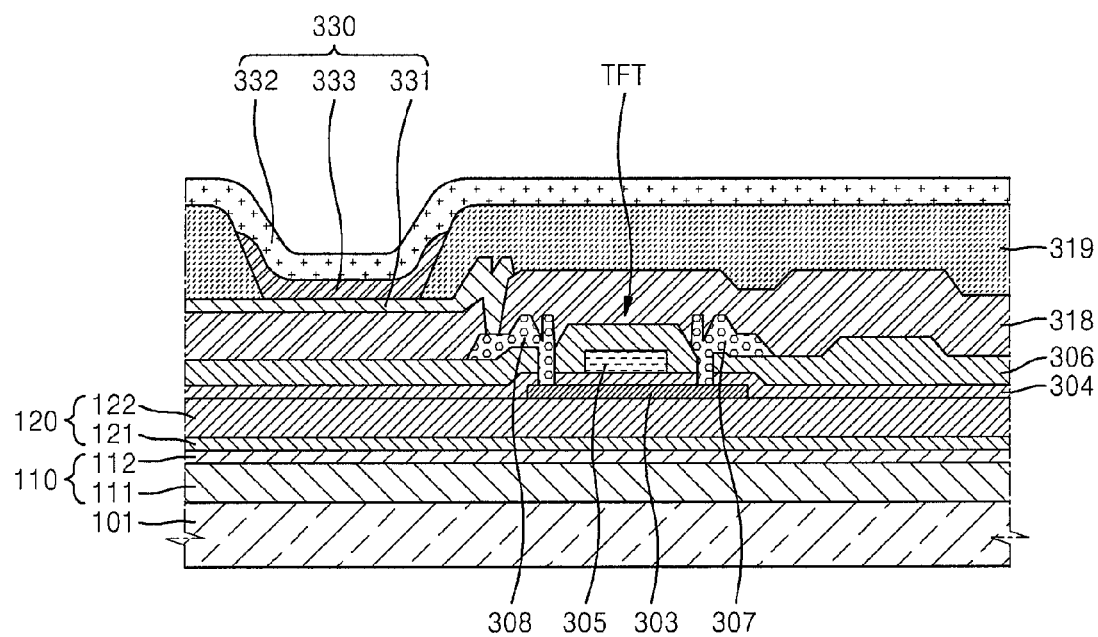

FIG. 5 is an enlarged view of a portion K in FIG. 1, and FIGS. 6 and 7 show modified examples of the portion K in FIG. 1.

Referring to FIG. 5, an organic light-emitting device 130 is formed on the substrate 101, in particular, on the buffer unit 120 and the barrier unit 110 that are formed on the substrate 101.

The organic light-emitting device 130 includes a first electrode 131, a second electrode 132, and an intermediate layer 133.

The first electrode 131 is formed on the buffer unit 120. The first electrode 131 may be formed of various conductive materials. According to one embodiment of the present invention, the first electrode 131 may include indium tin oxide (ITO), indium zinc oxide (IZO), ZnO, or $In_2O_3$. Also, according to another embodiment, the first electrode 131 may include a reflective layer formed of Ag, Mg, Al, Pt, Pd, Au, Ni, Nd, Ir, Cr, Li, Yb, or Ca.

The intermediate layer 133 is formed on the first electrode 131. The intermediate layer 133 includes an organic emission layer for emitting visible light. The intermediate layer 133 may be a low molecular weight or a high molecular weight organic layer. Also, the intermediate layer 133 includes the organic emission layer, and may additionally include one or more selected from a hole injection layer (HIL), a hole transport layer (HTL), an electron transport layer (ETL), and an electron injection layer (EIL).

The second electrode 132 may be formed on the intermediate layer 133. The second electrode 132 may be formed of various conductive materials, for example, metals such as Ag, Mg, Al, Pt, Pd, Au, Ni, Nd, Ir, Cr, Li, or Ca.

FIG. 6 is a cross-sectional view showing a modified example of the portion K in FIG. 1.

Referring to FIG. 6, an organic light-emitting device 230 is formed on the substrate 101, and in particular, on the buffer unit 120 and the barrier unit 110 formed on the substrate 101.

Only differences from the above embodiment will be described below for the sake of convenience.

A first electrode 231 is formed on the buffer unit 120.

The first electrode 231 may be formed of various conductive materials. A pixel defining layer 219 is formed of an insulating layer on the first electrode 231. The pixel defining layer 219 has an opening so as to expose an upper surface of the first electrode 231.

The intermediate layer 233 is formed on the exposed upper surface of the first electrode 231. The intermediate layer 233 includes an organic emission layer that emits visible light.

A second electrode 232 is formed on the intermediate layer 233.

FIG. 7 is a cross-sectional view showing another modified example of the portion K in FIG. 1.

Referring to FIG. 7, an organic light-emitting device 330 and a TFT are formed on the substrate 101, and in particular, on the buffer unit 120 and the barrier unit 110 formed on the substrate 101.

The organic light-emitting device 330 includes a first electrode 331, a second electrode 332, and an intermediate layer 333.

The TFT includes an active layer 303, a gate electrode 305, a source electrode 307, and a drain electrode 308.

The active layer 303 is disposed on an upper surface of the buffer unit 120 as a pattern (e.g., a predetermined pattern). The active layer 303 may include an inorganic semiconductor material such as silicon, an organic semiconductor material, or an oxide semiconductor material, and may be formed by injecting p-type or n-type dopants.

A gate insulating layer 304 is formed on the active layer 303. The gate electrode 305 is formed on the gate insulating layer 304 to correspond to (or in a location corresponding to or aligned with) the active layer 303.

An interlayer insulating layer 306 is formed to cover the gate electrode 305, and the source electrode 307 and the drain electrode 308 are formed on the interlayer insulating layer 306 to contact regions (e.g., predetermined regions) of the active layer 303.

A passivation layer 318 is formed to cover the source electrode 307 and the drain electrode 308, and an additional insulating layer may be further formed on the passivation layer 318 to planarize the TFT.

The first electrode 331 is formed on the passivation layer 318. The first electrode 331 is formed to be electrically connected to one of the source electrode 307 and the drain electrode 308 (e.g., the first electrode 331 is electrically connected to the source electrode 307 or the drain electrode 308).

In addition, the pixel defining layer 319 is formed on the first electrode 331. The pixel defining layer 319 is formed so as not to cover at least an area (e.g., a predetermined area)

on the upper surface of the first electrode 331. The intermediate layer 333 including the organic emission layer is formed on the upper surface of the first electrode 331. The second electrode 332 is formed on the intermediate layer 333.

In one embodiment, the display unit D includes the organic light-emitting device 130, 230, or 330; however, embodiments of the present invention may include various kinds of display unit D. For example, the display unit D may include various types of display devices such as a liquid crystal display (LCD) device.

According to one embodiment, when manufacturing the display apparatus, the barrier unit 110 and the buffer unit 120 are formed on the substrate 101. Also, the sum of the thickness T1 of the barrier unit 110 and the thickness T2 of the buffer unit 120 may range from 0.9 µm to 3 µm.

As such, a crack that may be generated in the display unit D or the substrate 101 may not spread to the barrier unit 110 and the buffer unit 120.

In addition, by setting the sum of the thickness T1 of the barrier unit 110 and the thickness T2 of the buffer unit 120 to be equal to 3 µm or less, the flexibility of the substrate 101 may be maintained when the substrate 101 is used together with the barrier unit 110 and the buffer unit 120. Therefore, the display apparatus 100 that is flexible may be manufactured.

Thus, the durability of the display apparatus 100 may be improved, generation of defects may be mitigated or prevented, and the flexibility may be improved. Thus, the display apparatus 100 may be manufactured to have improved user convenience.

Figure 8:
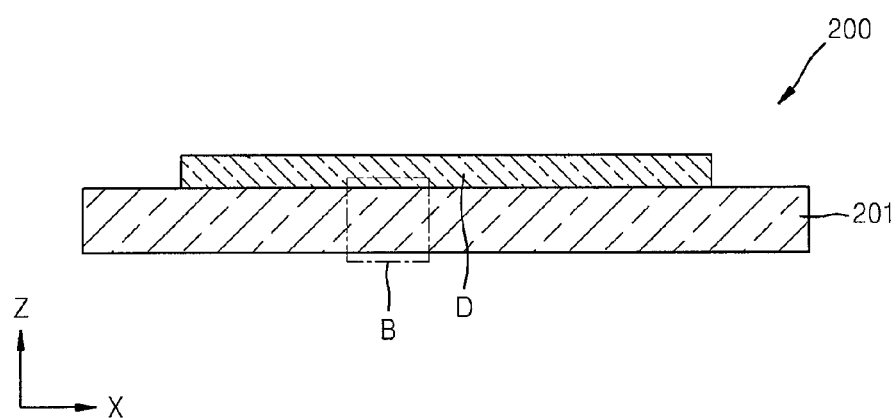
FIG. 8 is a schematic cross-sectional view of a display apparatus according to another embodiment of the present invention.
Figure 9:
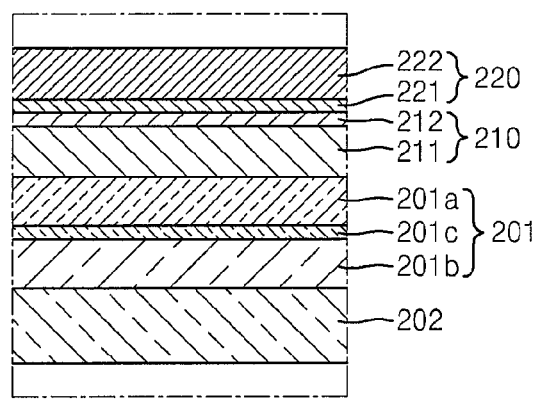
FIG. 9 is an enlarged view of a portion B in FIG. 8.

FIG. 8 is a cross-sectional view of a display apparatus 200 according to another embodiment of the present invention, and FIG. 9 is an enlarged view of a portion B of FIG. 8.

Referring to FIGS. 8 and 9, the display apparatus 200 of one embodiment includes the display unit D, a buffer unit 220, and a barrier unit 210. The encapsulation member 191 or 192 shown in FIGS. 2A and 2B may be used in the embodiments of the display apparatus 200.

Also, the display unit D may have the structure shown in FIG. 5, 6, or 7, and may include other various display devices.

For the sake of convenience, differences from the above embodiment will be described below.

The barrier unit 210 and the buffer unit 220 are sequentially formed on a substrate 201.

In one embodiment, a protective layer 202 may be further formed on a surface of the substrate 201 opposite a surface facing the barrier unit 210 and the buffer unit 220. The protective layer 202 may protect against or block impurities, humidity, or external air that may be introduced through a lower portion of the substrate 201, and may also mitigate or prevent deformation of the substrate 201.

The protective layer 202 may include various insulating materials, and may be formed on a surface of the substrate 201 in various ways. For example, the protective layer 202 of a film type may be formed on the surface of the substrate 201.

The substrate 201 may include a first layer 201a, a second layer 201b, and an insertion insulating layer 201c. In one embodiment, the insertion insulating layer 201c is disposed between the first layer 201a and the second layer 201b. The first layer 201a is closer to the barrier unit 210 than the second layer 201b is.

The first layer 201a and the second layer 201b may be formed of various materials. For example, the first layer 201a and the second layer 201b may be formed of a flexible material. According to one embodiment, the first layer 201a and the second layer 201b may be formed of an organic material. For example, the first layer 201a and the second layer 201b may include an organic material having excellent heat resistance and durability such as polyimide, polyethylene naphthalate, PET, polyarylate, polycarbonate, PEI, or polyethersulfone.

The insertion insulating layer 201c may be formed of various insulating materials. According to one embodiment, the insertion insulating layer 201c includes an oxide material or a nitride material, for example, a silicon oxide such as $SiO_2$.

The barrier unit 210 is formed on a surface of the substrate 201. The barrier unit 210 may include various insulating materials, and may be formed on the surface of the substrate 201 in various ways.

The barrier unit 210 operates as a planarization surface on an upper surface of the substrate 201, and may impede or prevent impurities and humidity from infiltrating into the display unit D from the substrate 201.

The barrier unit 210 may include an inorganic insulating layer, for example, silicon oxide or silicon nitride.

In one embodiment of the present invention, the barrier unit 210 includes a first barrier layer 211 and a second barrier layer 212. The second barrier 212 is formed on the first barrier layer 211. For example, the second barrier layer 212 is disposed farther from the substrate 201 than the first barrier 211 is.

Also, in an embodiment of the present invention, the first barrier layer 211 may include a silicon oxide, for example, SiOx. The second barrier layer 212 may include a silicon nitride, for example, SiNx.

In particular, the first barrier layer 211 is formed to be adjacent to the substrate 201, and the first barrier layer 211 includes silicon oxide so as to improve the interfacial bonding property between the first barrier layer 211 and the substrate 201. Also, if the second barrier layer 212 includes silicon nitride and a first buffer layer 221 that will be described later in the buffer layer 220 includes silicon nitride, the interfacial bonding property between the second barrier layer 212 and the first buffer layer 221 may be improved.

The buffer unit 220 is formed on the barrier unit 210. The buffer unit 220 may include various insulating materials, and may be formed on a surface of the barrier unit 210 in various ways.

The buffer unit 220 may operate as a planarization layer on the upper surface of the substrate 201, and may impede or prevent impurities and humidity from infiltrating into the display unit D from the substrate 201. In particular, because the display unit D is formed on the buffer unit 220, an uppermost surface of the buffer unit 220, for example, a second buffer layer 222 of the buffer unit 220 (that will be described later), may operate as a planarization layer.

The buffer unit 220 includes an inorganic insulating layer, for example, silicon oxide or silicon nitride.

As an embodiment of the present invention, the buffer unit 220 includes the first buffer layer 221 and the second buffer layer 222. The first buffer layer 221 is formed on the barrier unit 210, and the second buffer layer 222 is formed on the first buffer layer 221. For example, the second buffer layer 222 is disposed farther from the substrate 201 than the first buffer layer 221.

Also, the first buffer layer 221 may include a silicon nitride, for example, SiNx. The second buffer layer 222 may include a silicon oxide, for example, SiOx.

In particular, the second buffer layer 222 may be formed to be adjacent to the display unit D and the second buffer layer 222 may include silicon oxide so as to improve an interfacial bonding property between the display unit D and the buffer unit 220. Also, if the second barrier layer 212 includes silicon nitride and the first buffer layer 221 includes silicon nitride, the interfacial bonding property between the second barrier layer 212 and the first buffer layer 221 may be improved.

Also, the display unit D may include a TFT as described above, and the TFT includes an active layer 303 that may include a silicon material. In this case, an interfacial bonding property between the active layer 303 including silicon nitride and the second buffer layer 222 including silicon nitride is improved, and thus, the electrical properties of the TFT may be improved.

In addition, if the first buffer layer 221 includes silicon nitride, the silicon nitride may include hydrogen. As such, a mobility of carriers in the active layer 303 of the TFT may be improved provided that the display unit D formed on the buffer unit 220 includes the TFT. Accordingly, the electrical properties of the TFT may be improved.

A sum of a thickness T1 of the barrier unit 210 and a thickness T2 of the buffer unit 220 may range from 0.9 µm to 3 µm.

By setting the sum of the thickness T1 of the barrier unit 210 and the thickness T2 of the buffer unit 220 to be greater than or equal to 0.9 µm, infiltration of humidity or impurities into the barrier unit 210 and the buffer unit 220 may be effectively mitigated or prevented. Also, by setting the sum of the thickness T1 of the barrier unit and the thickness T2 of the buffer unit 220 to be greater than or equal to 0.9 µm, spreading of a crack generated in the display unit D or the substrate 201 to the barrier unit 210 or the buffer unit 220 may be mitigated or prevented. In addition, generation of the crack in the barrier unit 210 or the buffer unit 220 may be mitigated or prevented.

If a crack is generated or a generated crack starts spreading in the barrier unit 210 and the buffer unit 220, impurities, foreign substances, external air in the substrate 201, or gas remaining after forming the substrate 201 may be transferred to the display unit D via the crack generated in the barrier unit 210 and the buffer unit 220. In one embodiment, the above problem may be reduced by forming the sum of the thickness T1 of the barrier unit 210 and the thickness T2 of the buffer unit 220 to be greater than or equal to 0.9 µm.

For example, if the sum of the thickness of the barrier unit 210 and the buffer unit 220 is less than 0.9 µm, stiffness of the barrier unit 210 and the buffer unit 220 is reduced, and then, the barrier unit 210 and the buffer unit 220 may bend easily. Thus, a crack may be generated or a crack generated in the display unit D may be easily transferred. Therefore, according to some embodiments of the present invention, the sum of the thickness of the barrier unit 210 and the buffer unit 220 is greater than or equal to 0.9 µm.

In addition, the sum of the thickness of the barrier unit 210 and the buffer unit 220 is set to be equal to 3 µm or less, and thus flexibility of the substrate 201 may be maintained when the barrier unit 210 and the buffer unit 220 are used together with the substrate 201, thereby realizing the display apparatus 200 that is flexible.

If the sum of the thickness of the barrier unit 210 and the buffer unit 220 exceeds 3 µm, the efficiency of processes for manufacturing the barrier unit 210 and the buffer unit 220 is degraded, and the flexibility of the display apparatus 200 is reduced. Therefore, user's convenience and manufacturing process characteristics are degraded.

In one embodiment, the first barrier layer 211 of the barrier unit 210 has a thickness of 5000 Å, the second barrier layer 212 has a thickness of 600 Å, the first buffer layer 221 of the buffer unit 220 has a thickness of 500 Å, and the second buffer layer 222 has a thickness of 4000 Å.

The display apparatus 200 of one embodiment includes the first layer 201a, the second layer 201b, and the insertion insulating layer 201c, and thus, the substrate 201 may have excellent durability.

In particular, in the display apparatus 200 according to one embodiment, the substrate 201 has a structure in which the first layer 201 and the second layer 201b are sequentially stacked. Thus, impurities, external air, and foreign substances that may be introduced through the substrate 201 may be easily blocked or impeded. Thus, generation of a crack in the substrate 201 or transfer of a crack to the display unit D via the substrate 201 may be mitigated or prevented.

Also, because the insertion insulating layer 201c is disposed between the first layer 201a and the second substrate 201b, a coupling power between the first layer 201a and the second layer 201b may be improved. In addition, the insertion insulating layer 201c may secondarily impede or block the impurities or external air that may pass through the first layer 201a or the second layer 201b so as to improve durability and image quality characteristics of the display apparatus 200.

In addition, like the display apparatus 100 of the previous embodiment, the generation of crack or transferring of the crack may be mitigated or prevented so as to improve the durability of the display apparatus 200 that may be formed to be flexible.

FIGS. 10A, 10B, 10C, and 10D are schematic diagrams illustrating a method of manufacturing a display apparatus according to an embodiment of the present invention.

In detail, FIGS. 10A through 10D illustrate processes of manufacturing the display apparatus 100' of FIG. 2A. However, embodiments of the present invention are not limited thereto, and processes may be used to manufacture also the display apparatus shown in FIG. 1, 2B, or 7.

Figure 10A:
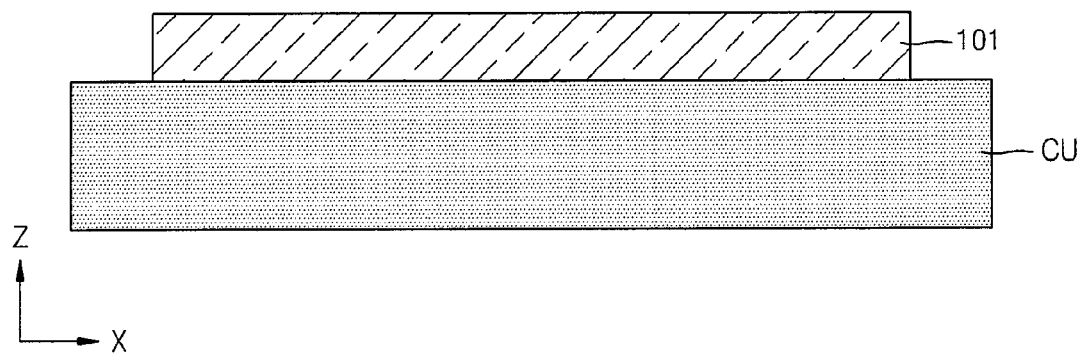
FIGS. 10A, 10B, 10C, and 10D are schematic diagrams illustrating a method of manufacturing a display apparatus according to an embodiment of the present invention.

Referring to FIG. 10A, the substrate 101 may be disposed on a carrier unit CU. The carrier unit CU may be formed of various materials, for example, a material having a strength that is greater than that of the substrate 101. For example, the carrier unit CU may be formed of a glass material. The carrier unit CU may allow easy handling of the substrate 101 of a thin film type during the manufacturing processes of the display apparatus 100'. For example, reduction in a processing accuracy caused by bending of the substrate 101 may be mitigated or prevented, and damage and deformation of the substrate 101 may also be mitigated or prevented, thereby improving the quality of the display apparatus 100'.

In particular, if the substrate 101 is formed of a flexible material, for example, if the display apparatus 100' that is manufactured is flexible, convenience in manufacturing processes may be improved.

Figure 10B:
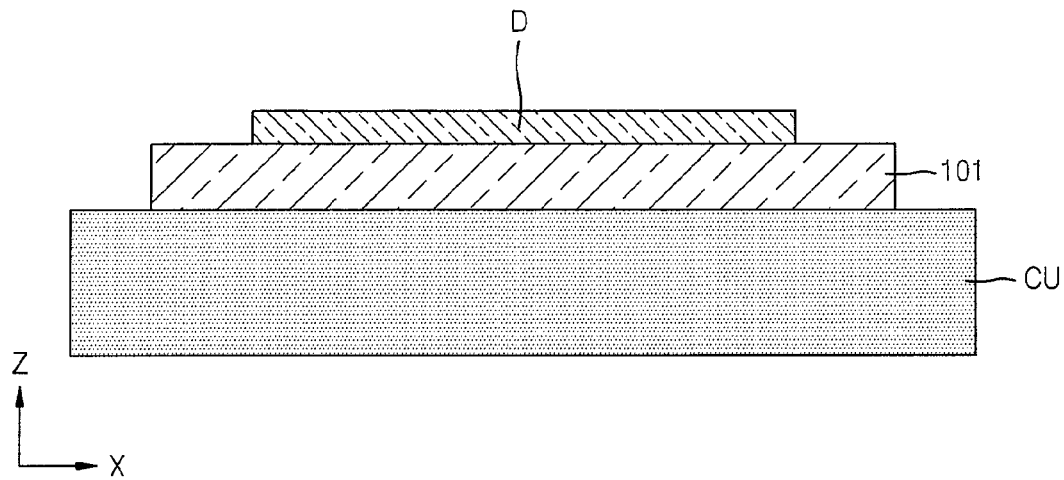

Referring to FIG. 10B, the display unit D is formed on the upper surface of the substrate 101, for example, a surface of the substrate 101 opposite the surface facing the carrier unit CU. Although not shown in FIG. 10B, the buffer unit and the barrier unit are formed between the substrate 101 and the display unit D.

Figure 10C:
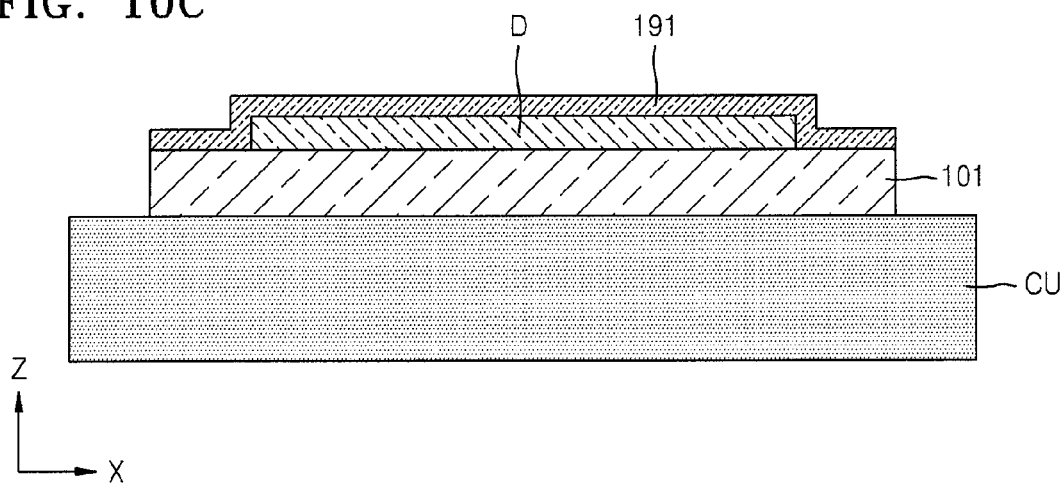

After that, referring to FIG. 10C, an encapsulation member 191 of an encapsulation layer type is formed on the display unit D. The encapsulation member 191 may be formed of various insulating materials, for example, an organic material or an inorganic material. The encapsulation member 191 may have a structure in which one or more organic layers and one or more inorganic layers are stacked.

Also, an encapsulation member 192 of a substrate type may be disposed on the display unit D to face the substrate 101 as shown in FIG. 2B, and a sealing member SE may be disposed between the substrate 101 and the encapsulation member 192 so that the substrate 101 and the encapsulation member 192 are coupled to each other by the sealing member SE.

Figure 10D:
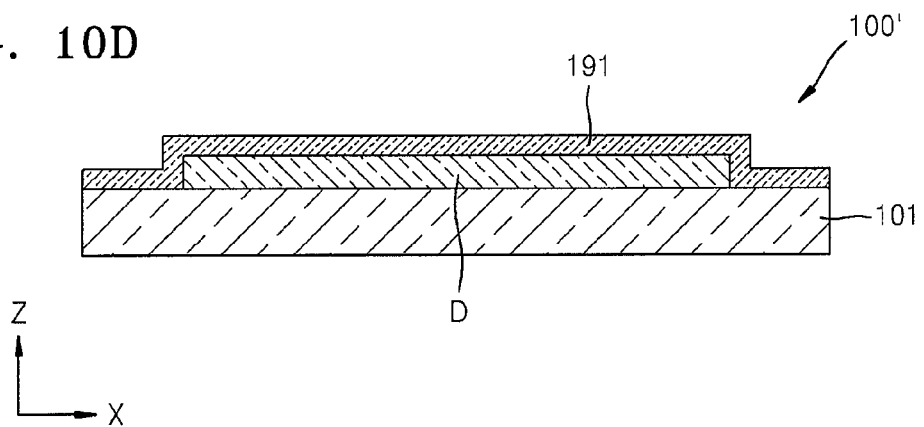

Referring to FIG. 10D, the carrier unit CU is removed to finish the manufacturing of the display apparatus 100'. If the carrier unit CU is removed after forming the display unit D and the encapsulation member 191, the display apparatus as shown in FIGS. 2A and 2B may be manufactured.

According to the manufacturing method of one embodiment, when the display apparatus 100' is manufactured by using the carrier unit CU, the substrate 101 may be easily handled.

In particular, if the substrate 101 is formed of a flexible material, for example, if the display apparatus 100' that is manufactured is flexible, the convenience in the manufacturing processes may be improved.

As described above, according to the one or more of the above embodiments of the present invention, the durability of the display apparatus and user's convenience may be improved.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and equivalents thereof.

What is claimed is:

1. A display apparatus comprising:
a substrate;
a display unit disposed on the substrate;
a barrier unit disposed between the substrate and the display unit; and
a buffer unit disposed between the barrier unit and the display unit,
wherein a sum of a thickness of the barrier unit and a thickness of the buffer unit is in a range from 0.9 μm to 3 μm, and
wherein the substrate comprises polyimide, polyethylene naphthalate, polyethylene terephthalate (PET), polyarylate, polycarbonate, polyetherimide (PEI), or polyethersulfone,
wherein the buffer unit comprises a first layer comprising silicon nitride,
wherein the barrier unit comprises a second layer comprising silicon nitride, and
wherein the first layer contacts the second layer.

2. The display apparatus of claim 1, wherein the barrier unit and the buffer unit each comprise an inorganic material.

3. The display apparatus of claim 1, wherein the barrier unit comprises an oxide material or a nitride material.

4. The display apparatus of claim 1, wherein the barrier unit has a structure in which an oxide material and a nitride material are stacked.

5. The display apparatus of claim 1, wherein the barrier unit comprises a first barrier layer comprising silicon oxide and a second barrier layer comprising silicon nitride, and
wherein the first barrier layer is between the second barrier layer and the substrate.

6. The display apparatus of claim 1, wherein the buffer unit comprises an oxide material or a nitride material.

7. The display apparatus of claim 1, wherein an uppermost layer of the buffer unit contacts the display unit and
wherein the uppermost layer comprises a flat surface.

8. The display apparatus of claim 1, wherein the substrate comprises an organic material.

9. The display apparatus of claim 1, wherein the substrate comprises a first layer including an organic material, a second layer including an organic material, and an insulating insertion layer disposed between the first layer of the substrate and the second layer of the substrate and including an inorganic material.

10. The display apparatus of claim 9, wherein the insulating insertion layer comprises an oxide material or a nitride material.

11. The display apparatus of claim 1, further comprising a protective layer on a surface of the substrate opposite a surface of the substrate facing the barrier unit.

12. The display apparatus of claim 1, wherein the display unit comprises an organic light emitting device.

13. The display apparatus of claim 1, wherein the display unit further comprises at least one thin film transistor (TFT).

14. The display apparatus of claim 1, further comprising an encapsulation member on the display unit.

15. A display apparatus comprising:
a substrate;
a display unit disposed on the substrate;
a barrier unit disposed between the substrate and the display unit; and
a buffer unit disposed between the barrier unit and the display unit,
wherein a sum of a thickness of the barrier unit and a thickness of the buffer unit is in a range from 0.9 μm to 3 μm,
wherein the substrate comprises polyimide, polyethylene naphthalate, polyethylene terephthalate (PET), polyarylate, polycarbonate, polyetherimide (PEI), or polyethersulfone, and
wherein the buffer unit comprises a structure in which an oxide material and a nitride material are stacked.

16. A display apparatus comprising:
a substrate;
a display unit disposed on the substrate;
a barrier unit disposed between the substrate and the display unit; and
a buffer unit disposed between the barrier unit and the display unit,
wherein a sum of a thickness of the barrier unit and a thickness of the buffer unit is in a range from 0.9 μm to 3 μm,
wherein the substrate comprises polyimide, polyethylene naphthalate, polyethylene terephthalate (PET), polyarylate, polycarbonate, polyetherimide (PEI), or polyethersulfone,
wherein the buffer unit comprises a first buffer layer comprising silicon nitride and a second buffer layer comprising silicon oxide, and
wherein the first buffer layer is between the second buffer layer and the substrate.

* * * * *